US008211760B2

(12) United States Patent  
Perkins et al.

(10) Patent No.: US 8,211,760 B2  
(45) Date of Patent: Jul. 3, 2012

(54) METHOD FOR PRODUCING A TRANSISTOR GATE WITH SUB-PHOTOLITHOGRAPHIC DIMENSIONS

(75) Inventors: Nathan Ray Perkins, Fort Collins, CO (US); Timothy Arthur Valade, Fort Collins, CO (US); Albert William Wang, Fort Collins, CO (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/084,820

(22) Filed: Apr. 12, 2011

(65) Prior Publication Data

US 2011/0250743 A1  Oct. 13, 2011

Related U.S. Application Data

(62) Division of application No. 11/930,494, filed on Oct. 31, 2007, now Pat. No. 7,947,545.

(51) Int. Cl.  
*H01L 21/338* (2006.01)  
*H01L 21/336* (2006.01)  
*H01L 21/28* (2006.01)  
*H01L 21/31* (2006.01)

(52) U.S. Cl. ........ 438/182; 438/285; 438/604; 438/779; 257/E21.035; 257/E21.037

(58) Field of Classification Search .................. 438/182, 438/259, 270, 285, 590, 602–606, 779; 257/E21.035–E21.038  
See application file for complete search history.

(56) References Cited

U.S. PATENT DOCUMENTS

| | | | |
|---|---|---|---|
| 5,445,979 A | 8/1995 | Hirano | |
| 5,719,088 A * | 2/1998 | Huang et al. | 438/637 |
| 5,930,610 A | 7/1999 | Lee | |
| 6,153,499 A | 11/2000 | Anda et al. | |
| 7,422,971 B2 | 9/2008 | Murthy | |
| 2003/0209811 A1 * | 11/2003 | Holm et al. | 257/784 |
| 2005/0127398 A1 | 6/2005 | Taniguchi et al. | |
| 2005/0282393 A1 | 12/2005 | Cheng et al. | |
| 2006/0194367 A1 | 8/2006 | Tanida et al. | |
| 2006/0226442 A1 | 10/2006 | Zhang | |
| 2006/0292767 A1 * | 12/2006 | Gonzalez et al. | 438/158 |

FOREIGN PATENT DOCUMENTS

WO  WO 2007066937 A1 *  6/2007

\* cited by examiner

*Primary Examiner* — Kevin Parendo

(57) ABSTRACT

A method of fabricating a semiconductor device is disclosed. The method comprises patterning a photoresist over a compound semiconductor substrate; reducing a width of the photoresist; forming a hardmask over the substrate and not over the photoresist; removing the photoresist; etching to form and opening down to the substrate; forming a gate in the opening; and removing the hardmask except beneath the gate.

7 Claims, 4 Drawing Sheets

METHOD FOR PRODUCING A TRANSISTOR GATE WITH SUB-PHOTOLITHOGRAPHIC DIMENSIONS

CROSS-REFERENCE TO RELATED APPLICATIONS

The present application is a divisional patent application under 35 U.S.C. §121 of and claims priority from commonly owned U.S. patent application Ser. No. 11/930,494, to Perkins, et al., filed on Oct. 31, 2007 now U.S. Pat. No. 7,947,545. The disclosure of U.S. patent application Ser. No. 11/930,494 is specifically incorporated herein by reference.

BACKGROUND

Compound semiconductor devices, such as Group III-V semiconductor devices, are ubiquitous in a wide variety of electronic components, particularly high-frequency components operating at radio frequency (RF), microwave and millimeter (mm) wave frequencies. One common type of compound semiconductor device is a gate-controlled device. Known gate-controlled devices include a metal semiconductor field effect transistor (MESFET), a high-electron mobility transistor (HEMT), and, to a lesser degree currently, a metal oxide semiconductor field effect transistor (MOSFET).

In an effort to improve the operational speed of these semiconductor devices as well as to increase the throughput per wafer during manufacture, there is a need to reduce the size of the devices. One way to reduce the size of the device is to reduce the size of the features of the device, such as the gate. Minimization of transistor gate dimensions is typically advantageous in a number of areas, particularly in minimizing gate capacitance, increasing maximum transistor current, and in increasing the maximum operating frequency of the transistor. In the silicon-based complementary metal oxide semiconductor (CMOS) processing, minimization of gate dimension (to at least 65 nm) is achieved using very expensive deep-UV (wavelengths of 193 nm and below) stepper-scanner tools, coupled with expensive phase shifting and optical proximity correction mask technologies.

While advantageous, methods used in reduced feature-size CMOS processing have not found acceptance in the compound semiconductor market, primarily because of unfavorable economics for high capital and mask costs at low production volumes. In addition, because of wafer flatness and topology issues in compound semiconductors, the methods used in Si processing may not be functional.

As a result, the most prevalent compound semiconductor industry solution for producing sub-0.25 μm compound semiconductor gates is e-beam lithography. E-beam lithographic tools have the disadvantage of being more costly than conventional optical patterning technologies. Moreover, because all features are fabricated in a time-consuming sequence rather than in large scale batch-mode processing, compound semiconductor devices fabricated by E-beam direct write methods enjoy a comparatively lower throughput. Furthermore, E-beam tools typically use a combined positive/negative resist stack in which a metal gate is evaporated and then lifted, producing a narrow but fragile vertical gate.

There is a need, therefore, for a method of fabricating compound semiconductor devices that overcomes at least the shortcoming of known methods discussed above.

SUMMARY

In a representative embodiment, a method of fabricating a semiconductor device includes: forming a mask layer over a compound semiconductor substrate; patterning a photoresist over the mask layer; etching a portion of the mask layer beneath the photoresist; forming a hardmask over the substrate and not over the mask layer; removing the mask layer; etching to form and opening down to the substrate; and forming a gate in the opening.

In another representative embodiment, a method of fabricating a semiconductor includes: patterning a photoresist over a compound semiconductor substrate; reducing a width of the photoresist; forming a hardmask over the substrate and not over the photoresist; removing the photoresist; etching to form and opening down to the substrate; and forming a gate in the opening.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features.

DEFINED TERMINOLOGY

As used herein, the terms 'a' or 'an', as used herein are defined as one or more than one.

DETAILED DESCRIPTION

In the following detailed description, for purposes of explanation and not limitation, representative embodiments disclosing specific details are set forth in order to provide a thorough understanding of the present teachings. Descriptions of known devices, materials and manufacturing methods may be omitted so as to avoid obscuring the description of the example embodiments. Nonetheless, such devices, materials and methods that are within the purview of one of ordinary skill in the art may be used in accordance with the representative embodiments.

Many of the semiconductor processing sequences and materials noted in connection with the representative embodiments are known to those of ordinary skill in the art of compound semiconductor device and circuit fabrication. In order to avoid obscuring the description of the representative embodiments, details of many of the processing sequences and materials are omitted, with the expectation that such are within the purview of one of ordinary skill in the art. Moreover, variants of the noted processing sequences and materials will be contemplated by one of ordinary skill in the art having had the benefit of the present disclosure. Such variants are considered within the scope of the present teachings.

Figure 1:
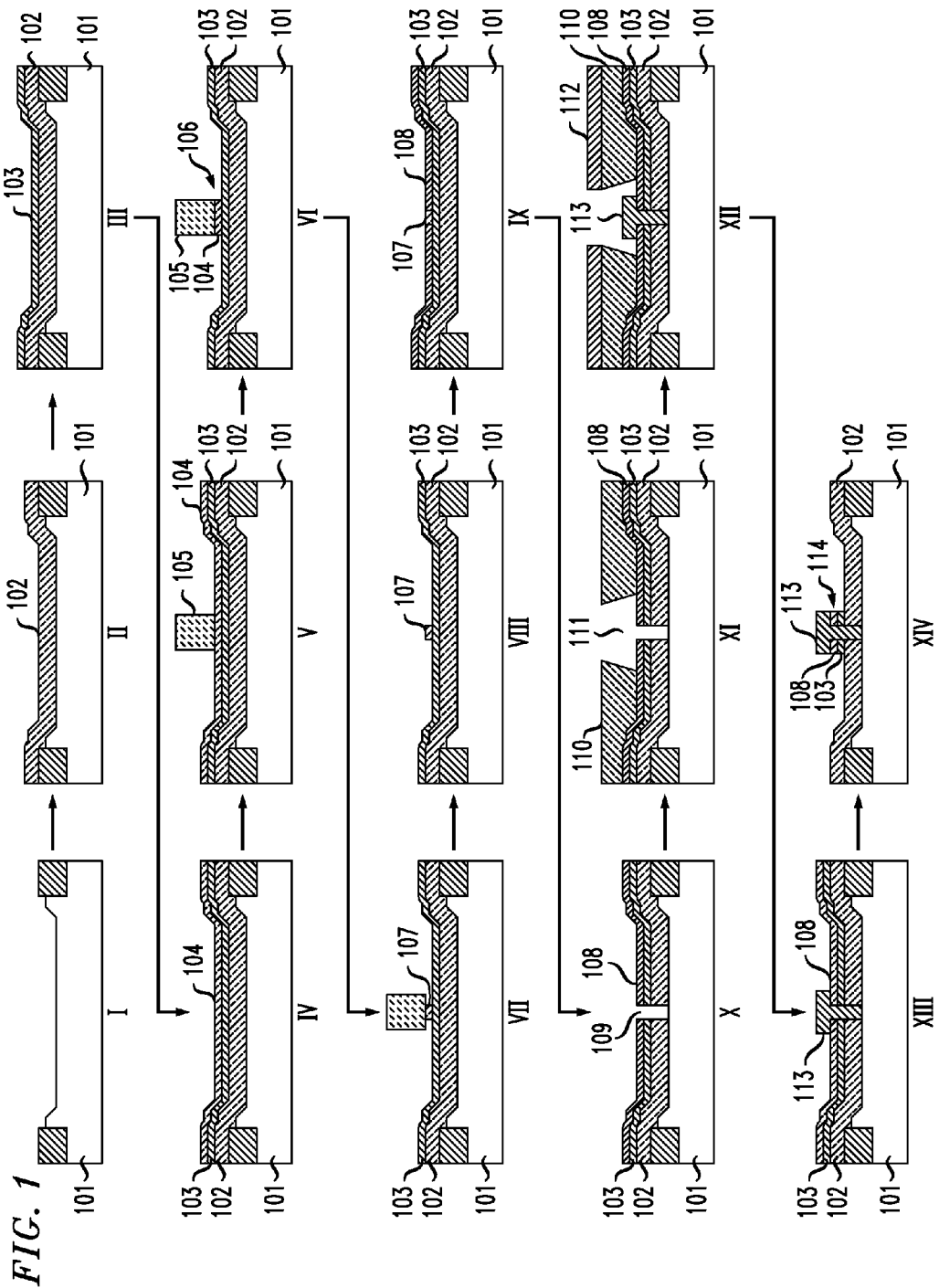
FIG. 1 is a series of cross-sectional views showing a fabrication sequence in accordance with a representative embodiment.

FIG. 1 is a series of cross-sectional views showing a fabrication sequence in accordance with a representative embodiment. At step I, a substrate 101 is provided. The substrate may be a Group III-V semiconductor with the desired stoichiometry for the particular application. Moreover, doping to form the various regions of the device; epitaxial growth and deposition to form desired layers for various functions may be carried out prior to or after the gate fabrication sequence of the representative embodiments. The description of these sequences are omitted to avoid obscuring the description of the representative embodiments.

At step II, a dielectric layer 102 is provided (e.g., by a known deposition method) over the substrate 101. This layer forms a mask for subsequent steps and in some embodiments provides structural support to the comparatively narrow gate. At step III, a hard mask layer 103 (e.g., a metal or metal alloy) is formed over the dielectric layer. This hard mask layer 103, among other functions, provides a seed layer for another hard mask formed in a subsequent step.

At step IV a mask layer 104 is formed over the hard mask layer 103. The mask layer 104 may be a dielectric layer or a metal/metal alloy layer, and is a comparatively wide layer. As described more fully herein, mask layer 104 functions as a mask for forming a comparatively small feature size opening in the underlying layers. The opening is used for forming a gate with comparatively small features size in a batch processing sequence and without expensive e-beam direct write equipment.

At step V a patterned photoresist 105 (also referred to as "resist")is formed over the mask layer 104 by known methods. With the resist 105 protecting a desired width of the mask layer 104, the exposed area of the mask layer 104 is etched and removed by a known wet or dry etching method. As shown at step VI, a first gate mask 106 remains after the etching. Next, at step VII, a undercut etching step is carried out to further narrow the width of the first gate mask 106 to form a second (final) gate mask 107. This etching sequence is likely a wet etching sequence and is operative to reduce the width of the first gate mask 106 from approximately 1.0 tm to less than approximately 0.25 tm or less as the second gate mask 107. In certain embodiments, the width of the second gate mask 107 can be approximately 0.1 μm. Beneficially, the second gate mask 107 is self-aligned; is formed using known photolithographic methods and fabrication equipment; and functions to provide the opening for forming a self-aligned gate in a later step.

At step VIII, the resist 105 is removed and leaving the reduced feature-size second gate mask 107. Next, at step IX another hardmask layer 108 is formed over the hardmask layer 103. Notably, the hardmask layer 103 functions as a seed layer for the hardmask layer 108, which is illustratively a metal (e.g., Au) or metal alloy, and may be formed by a known electroplating method. More notably, the second gate mask 107 is inert to the material selected for the hardmask layer 108, and thus, the hard mask layer 108 does not form over the gate mask 107. In addition, the hardmask layer 108 is inert to subsequent processing to remove the second gate mask 107.

At step X the hard mask layer 108 provides a masking function for the removal of the second gate mask 107 and portions of the hardmask layer 103 and dielectric layer 102 beneath the unmasked layer. This removal is effected using a comparatively highly anisotropic etching method to preserve the width of an opening 109 to be substantially the same as the width of the gate mask 107 formed previously. Illustrative etching methods may include plasma etching and other dry etching methods (e.g., the so-called 'Bosch' method) as well as highly anisotropic wet etching methods within the purview of one of ordinary skill in the art. Regardless of the etching method used, the opening 109 has a width on the order of the width of the second gate mask 107 which is illustratively approximately 0.25 μm to approximately 0.1 μm. Beneficially, this allows for a gate having a width of approximately the same width to be formed with only comparatively straight-forward photolithographic methods and using comparatively inexpensive equipment. Moreover, the methods described may be carried out in large scale, such as over an entire wafer and in batch-mode.

At step XI, a third gate mask layer 110 is formed and using a known photolithographic process, is etched to form another opening 111 for gate formation. At step XII a gate layer 112 is formed by evaporation or other form of deposition, or by plating and forms a gate 113 in and about the opening 109. At step XIII, a lift-off sequence is effected to remove the gate layer 112 and the third gate mask layer 110. At step XIV, the hard mask layers 103, 108 are removed, using the gate 113 as a hardmask. As will be appreciated, the combination of the hard mask layers 103, 108 and the dielectric layer 102 in the region beneath the gate as shown in step XIV results in a comparatively small feature size mechanically supported gate 114.

Figure 2:
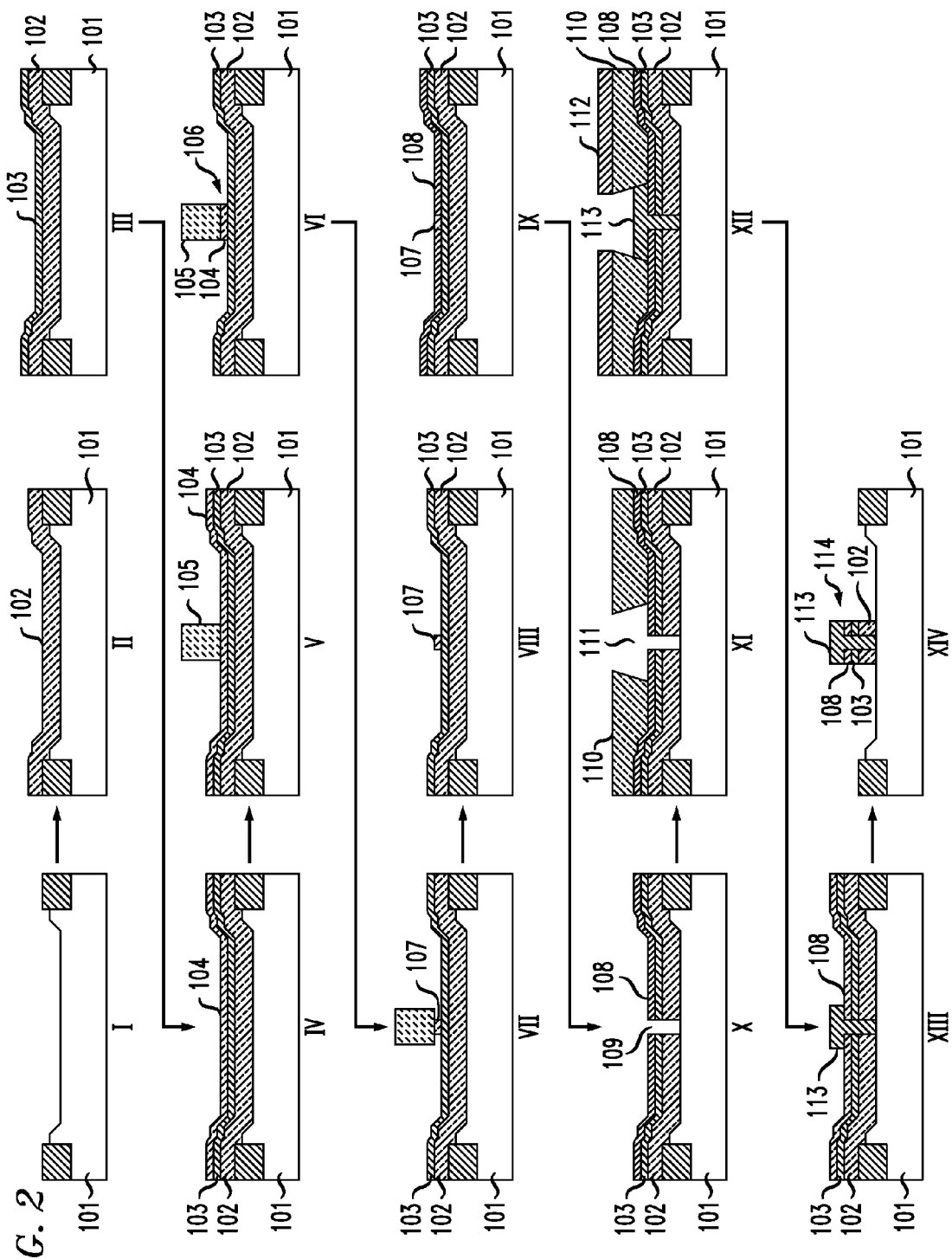
FIG. 2 is a series of cross-sectional views showing a fabrication sequence in accordance with a representative embodiment.

FIG. 2 is a series of cross-sectional views showing a fabrication sequence in accordance with a representative embodiment. The representative embodiments of FIG. 2 are substantially identical to those of FIG. 1, excepting, at step XIV, the gate 114 functions as a hard mask allowing for the removal of the dielectric layer 102 in all regions excepting under beneath the hard mask layers 103, 108 beneath the gate 114. This provides the improved mechanical support to the gate 114, but reduces parasitic capacitance, which can be deleterious to electrical performance, particularly in high-speed devices and components.

Figure 3:
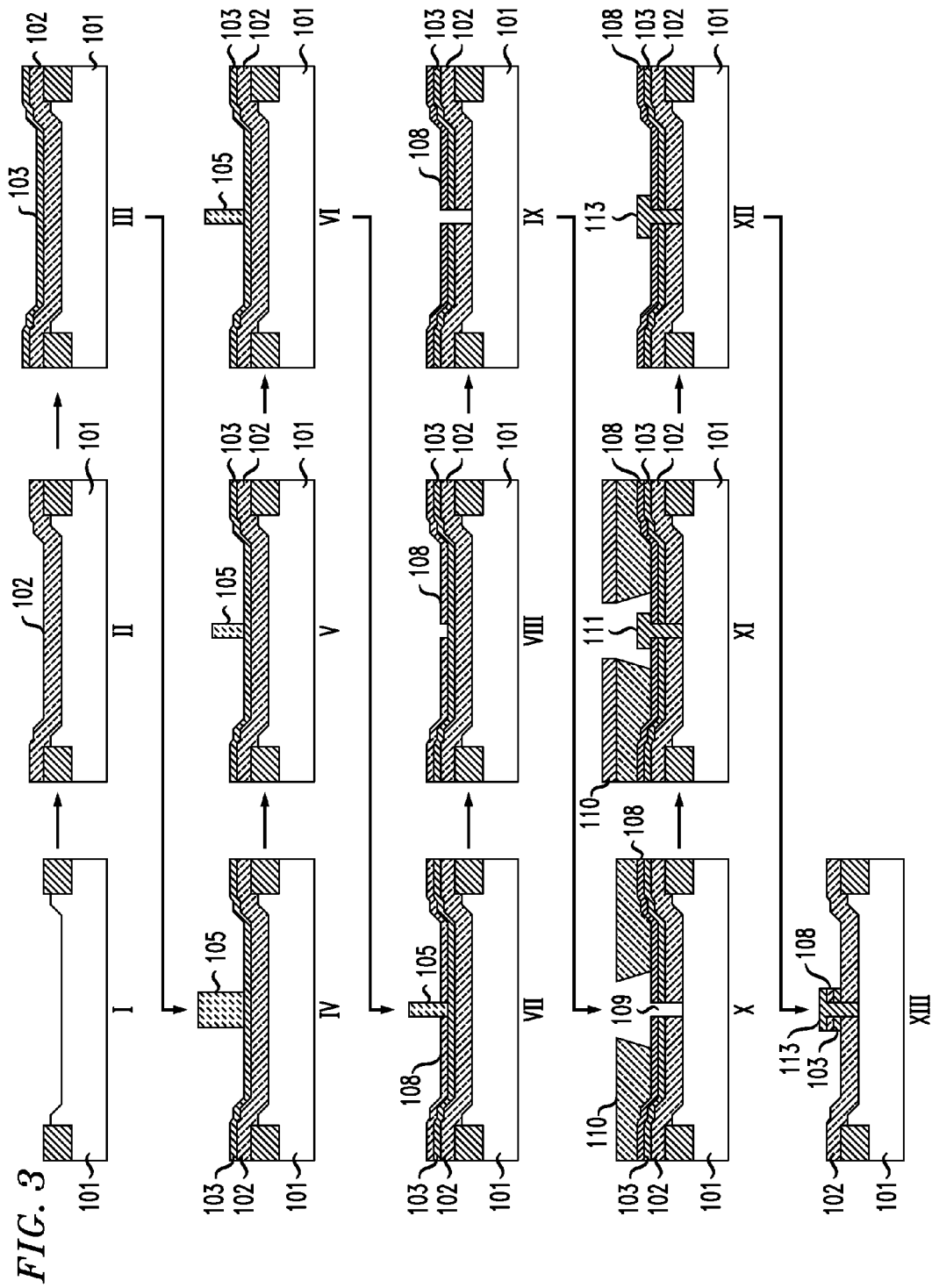
FIG. 3 is a series of cross-sectional views showing a fabrication sequence in accordance with a representative embodiment.

FIG. 3 is a series of cross-sectional views showing a fabrication sequence in accordance with a representative embodiment. Many of the materials and methods described in connection with the embodiments of FIGS. 1 and 2 are applicable to the presently described embodiments. Many common details thereof are not repeated in order to avoid obscuring the description of the representative embodiments.

In the presently described embodiments, the gate mask 107 is foregone, and the resist 105 provides its function. As such, the resist 105 is formed over the hard mask layer 103 at step IV and patterned at step V. At step VI, the resist 105 is further reduced in width by a direct etch reduction (for example, using an oxygen plasma etch sequence). At step V, the resist 105 thus has the desired feature size for the gate. At step VII, the hardmask layer 108 is formed over the hardmask 103, and does not form over the resist 105. The processing sequence continues in substantially the same manner as described previously in connection with steps X-XIV of the embodiments of FIG. 1. Notably, at step VIII, the resist 105 is removed; at step IX the self-aligned reduced feature size opening 109 is provided down to the substrate 101 by anisotropic etching. At step X, the opening 111 is formed in the third gate mask layer 110; at step XI gate conductor is provided to form the gate; followed by steps XIII and XIV resulting in the reduced feature-size gate 114.

Figure 4:
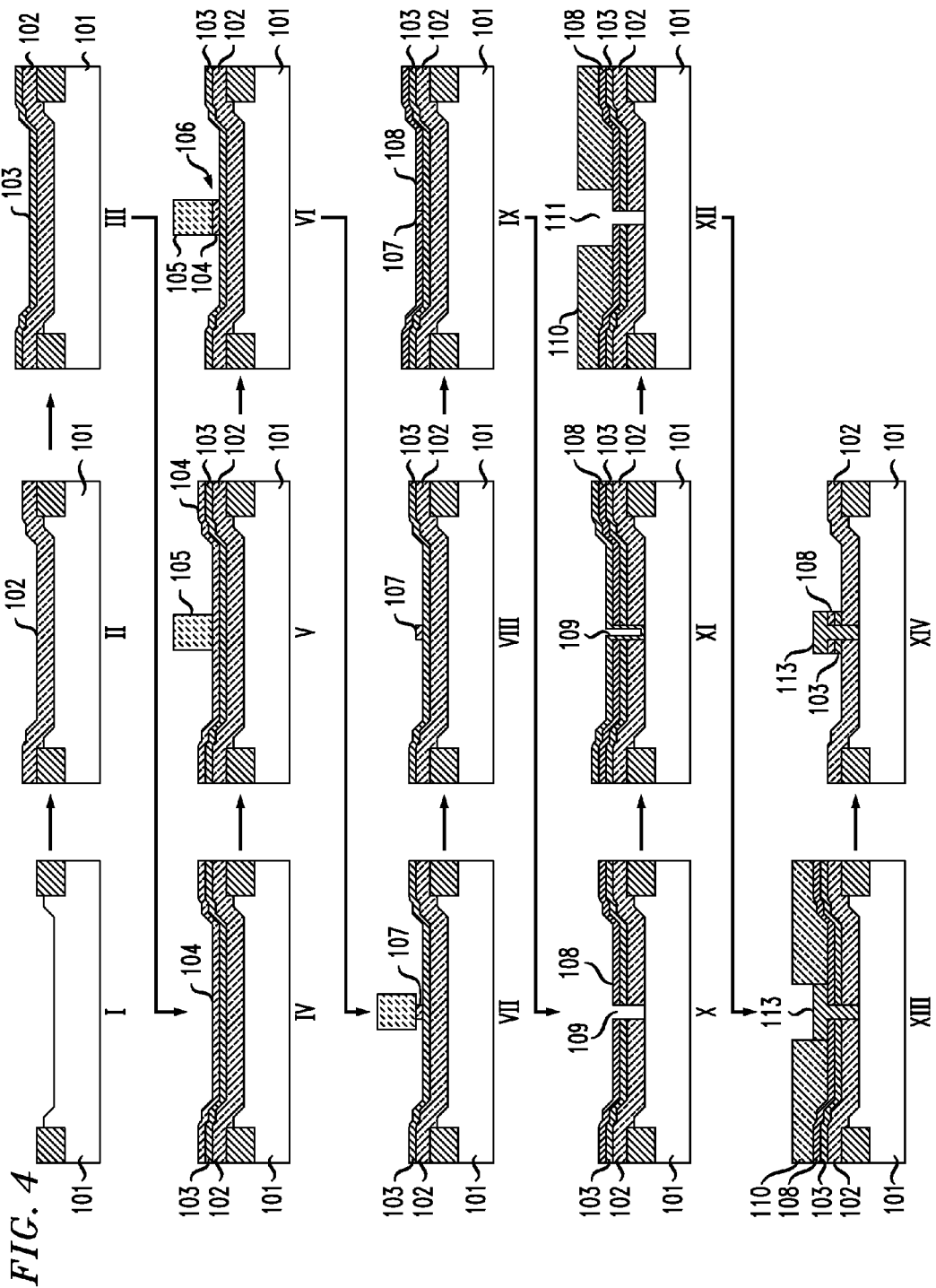
FIG. 4 is a series of cross-sectional views showing a fabrication sequence in accordance with a representative embodiment.

FIG. 4 is a series of cross-sectional views showing a fabrication sequence in accordance with a representative embodiment. Many of the materials and methods described in connection with the embodiments of FIGS. 1-3 are applicable to the presently described embodiments. Many common details thereof are not repeated in order to avoid obscuring the description of the representative embodiments.

The process sequence of the representative embodiments of FIG. 4 are substantially identical to those of FIG. 1, excepting at steps XII-XIV. Beginning at step XII, rather than by evaporation, the gate layer 112 is electroplated, with the hardmask layer 108 exposed in the opening 109 acting as a seed layer for the plating of the metal (e.g., Au) or metal alloy. After the plating sequence is completed, the dielectric layer 110 is removed by a known technique, and the hardmask layers 103, 108 are deplated as shown in step XIII The final structure, which is shown in step XIV, includes the dielectric layer 102, and the remaining portions of the hardmasks 103, 108 beneath the gate 114 providing support to the gate 114. Thereafter, optionally, the dielectric layer 102 not beneath the gate may be removed as described in connection with step XIV of FIG. 2.

In view of this disclosure it is noted that the various methods of fabricating a gate structure described herein can be implemented in a variety of materials and variant structures. Moreover, applications other than gate fabrication in compound semiconductors may benefit from the present teachings. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

The invention claimed is:

1. A method of fabricating a semiconductor device, the method comprising:

patterning a photoresist over a compound semiconductor substrate;
reducing a width of the photoresist;
forming a hardmask over the compound semiconductor substrate and not over the photoresist;
removing the photoresist;
etching to form an opening down to the compound semiconductor substrate;
forming a gate in the opening; and
removing the hardmask except beneath the gate.

2. A method as claimed in claim 1, further comprising, before patterning the photoresist, forming a dielectric layer over the compound semiconductor substrate, wherein the opening is formed through the dielectric layer.

3. A method as claimed in claim 2, further comprising, removing the dielectric over the compound semiconductor substrate except in a region beneath a portion of the gate.

4. A method as claimed in claim 1, wherein the etching to form an opening is an anisotropic etching.

5. A method as claimed in claim 1, wherein the forming the gate comprises a lift-off process.

6. A method as claimed in claim 1, wherein the forming the gate comprises a plating process.

7. A method as claimed in claim 1, wherein the compound semiconductor substrate comprises a Group III-V semiconductor material.

* * * * *